United States Patent
Miyakuni et al.

(10) Patent No.: US 6,271,098 B1
(45) Date of Patent: Aug. 7, 2001

(54) HETEROJUNCTION BIPOLAR TRANSISTOR AND METHOD FOR PRODUCING THE SAME

(75) Inventors: Shinichi Miyakuni; Teruyuki Shimura, both of Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/552,694

(22) Filed: Apr. 19, 2000

Related U.S. Application Data

(62) Division of application No. 08/985,364, filed on Dec. 4, 1997, now Pat. No. 6,081,003.

(30) Foreign Application Priority Data

Jun. 4, 1997 (JP) .................................................... 9-163278

(51) Int. Cl.$^7$ ................................................ H01L 21/331
(52) U.S. Cl. ............................................ 438/312; 257/197
(58) Field of Search ........................... 438/312, 314, 438/331, 343, FOR 293; 257/198, 582

(56) References Cited

U.S. PATENT DOCUMENTS

| | | |
|---|---|---|
| 4,593,457 | 6/1986 | Birrittella . |
| 5,389,554 | 2/1995 | Liu et al. . |
| 5,468,658 | 11/1995 | Bayraktaroglu . |
| 5,698,868 | * 12/1997 | Awano et al. . |
| 5,710,439 | * 1/1998 | Ohkubo . |
| 5,721,437 | 2/1998 | Twynam et al. . |
| 5,859,447 | 1/1999 | Yang et al. . |
| 5,943,577 | * 8/1999 | Contrata et al. . |
| 6,097,036 | * 1/2000 | Teshima et al. . |
| B1 6,190,975 | * 9/1997 | Kubo et al. . |

FOREIGN PATENT DOCUMENTS

| 4251937 | 9/1992 | (JP) . |
|---|---|---|
| 77013 | 1/1995 | (JP) . |

\* cited by examiner

Primary Examiner—George Fourson
Assistant Examiner—Thanh V Pham
(74) Attorney, Agent, or Firm—Birch, Stewart, Kolasch & Birch, LLP

(57) ABSTRACT

A heterojunction bipolar transistor is provided with a ballast resistor layer in an emitter layer which prevents the current amplification factor $\beta$ from decreasing.

The n-GaAs carrier supply layer having a specified carrier concentration is formed between the ballast resistor layer and the n-AlGaAs layer.

4 Claims, 8 Drawing Sheets

HETEROJUNCTION BIPOLAR TRANSISTOR AND METHOD FOR PRODUCING THE SAME

This application is a continuation divisional of co-pending Application No. 08/985,364, filed on Dec. 4, 1997, now U.S. Pat. No. 6,081,003, the entire contents of which are hereby incorporated by reference.

BACKGROUND OF THE INVENTION

1. Field of the Invention

The present invention relates to the realization of high performance of a heterojunction bipolar transistor (HBT). More particularly, it relates to the realization of high performance of an HBT having a ballast resistor layer in an emitter layer.

2. Description of the Related Art

FIG. 11 is a sectional view of an HBT based on GaAs/AlGaAs of the conventional structure. An emitter layer consists mainly of an n-AlGaAs layer, a base layer mainly of a p-GaAs layer and a collector mainly of an n-GaAs layer. The emitter layer includes an n-InGaAs contact layer having a narrow band gap and the collector layer includes an n-GaAs contact layer formed therein. In the drawing, the numeral 1 denotes an $n^+$-$In_{0.5}Ga_{0.5}As$ layer, 2 denotes an $n^+$-$In_xGa_{1-x}As$ (x=0 to 0.5) layer, 3 denotes an $n^+$-GaAs, layer 4 denotes an $n^-$-GaAs ballast resistor layer, 6 denotes an n-$Al_yGa_{1-y}As$ layer (y=0 to 0.26), 7 denotes an n-$Al_{0.26}Ga_{0.74}As$ layer, 8 denotes a non-doped GaAs layer, 9 denotes a $p^+$-GaAs base layer, 10 denotes an $n^-$-GaAs collector layer, 21 denotes an emitter electrode, 22 denotes a base electrode and 23 denotes a collector electrode.

In such a structure as described above, when the device temperature rises due to the HBT operation, the number of electrons flowing through the device, namely the current in the emitter region, increases leading to instability of the device characteristics.

In order to counter this problem, a ballast resistor layer 4 (carrier concentration: $1\times10^{16}$ cm$^{-3}$, film thickness: 2000 Å) which acts as a resistor when the device temperature rises resulting in increased current, is provided between the $n^+$-GaAs layer 3 and the n-AlGaAs layer 6 in the emitter region, thereby causing the current to flow through the resistor layer 4 and preventing excessive current from flowing.

Although device characteristics can be prevented from being destabilized, by increasing the device temperature in the HBT which has the ballast resistor layer 4 formed therein, a new problem arises in that the current amplification factor β (rate of change in collector current $I_C$ to a minute change in base current $I_B$ when voltage $V_{CE}$ between the collector and the emitter is constant) of the HBT decreases compared to the HBT having a conventional structure.

The present inventors found the following fact as a result of an intensive study. That is, in the HBT shown in FIG. 11, since the ballast resistor layer 4 (carrier concentration: $1\times10^{16}$ cm$^{-3}$) is formed on the n-AlGaAs layer 6 (carrier concentration: $5\times10^{17}$ cm$^{-3}$) in the emitter layer, carriers are diffused from the n-AlGaAs layer 6 where the carrier concentration is high to the $n^-$-GaAs layer of the ballast resistor layer 4, resulting in decreased carrier concentration in the n-AlGaAs layer 6. While such a decrease in the carrier concentration in the n-AlGaAs layer 6 causes the absolute value of the temperature coefficient $\phi(=\delta V_{BE}/\delta T)$ of the emitter-base voltage $V_{BE}$ to increase under a condition that the emitter current of the HBT is constant and, as a result, causes the current amplification factor β of the HBT to decrease.

SUMMARY OF THE INVENTION

Thus, the present invention includes providing an HBT structure with a ballast resistor layer in an emitter layer thereof, which can prevent the current amplification factor β from decreasing, and a method for producing the same The present inventors have intensively studied. As a result, it has been found that the carrier concentration in the n-AlGaAs layer can be prevented from decreasing by forming an n-GaAs carrier supply layer having a specified carrier concentration between the ballast resistor layer and the n-AlGaAs layer, thereby completing the present invention.

That is, the present invention provides a first conductivity type GaAs collector region; a second conductivity type GaAs base region formed on the first conductivity type GaAs collector region; an emitter region formed on the second conductivity type GaAs base region, including at least a first conductivity type AlGaAs layer and a first conductivity type GaAs ballast resistor layer formed on the first conductivity type AlGaAs layer; and a first conductivity type GaAs carrier supply layer which includes carriers of such a concentration that prevents the carriers from being depleted, and is provided between the first conductivity type AlGaAs layer and the first conductivity type GaAs ballast resistor layer.

By providing the first conductivity type GaAs carrier supply layer including carriers of, such a concentration that prevents the carriers from being depleted between the first conductivity type AlGaAs layer and the first conductivity type GaAs ballast resistor layer, drifting of the carriers from the AlGaAs layer can be prevented by replenishing the carriers which have moved from the AlGaAs layer to the GaAs ballast resistor layer of a lower concentration to balance the Fermi levels of both layers in the related art.

This configuration prevents the carrier concentration of the AlGaAs layer from decreasing even in the HBT having the GaAs ballast resistor layer, thereby making it possible to stabilize the absolute value of $\phi(\delta V_{BE}/\delta T)$ of the HBT and prevent the current amplification factor β from decreasing.

The carrier concentration in the first conductivity GaAs carrier supply layer is preferably higher than the carrier concentration in the first conductivity AlGaAs layer.

By setting the carrier concentration in the GaAs carrier supply layer higher than that of the AlGaAs layer, carriers can be prevented from flowing out of the AlGaAs layer.

The carrier concentration in the GaAs carrier supply layer is preferably from about 1.0 to $5.0\times10^{18}$ cm$^-$.

The proportion of Al in the first conductivity type AlGaAs layer is preferably 0.20 or more.

The HBT of the present invention preferably further comprises an $In_xGa_{1-x}As$ (0<x<0.5) emitter contact layer on the emitter region.

The present invention also provides a method for producing an HBT, which comprises the steps of: forming a first conductivity type GaAs collector substrate; laminating a second conductivity type GaAs base region, and an emitter region which includes at least a first conductivity type AlGaAs layer, a first conductivity type GaAs carrier supply layer formed on the first conductivity type AlGaAs layer, and a first conductivity type GaAs ballast resistor layer formed on the first conductivity type GaAs carrier supply layer, on the first conductivity type GaAs collector substrate; forming an emitter electrode on the emitter region; etching the emitter region until the base region is exposed by using the emitter electrode as a mask, thereby forming emitter mesa portions; and providing a base electrode on the base region and a collector electrode on the collector region, respectively.

The step of forming the emitter mesa portions preferably includes a first step of etching the emitter region down to the AlGaAs layer through selective etching by using the AlGaAs layer as the etching stopper layer, and a second etching step of etching the remaining emitter region until the base region is exposed.

The etching step which uses the AlGaAs layer as the etching stopper layer is capable of etching to uniform depth, resulting in uniform depth of the etching mesa which is formed by etching the remaining emitter region to expose the base surface, thereby making it possible to reduce the variations in the characteristics among devices.

The first etching step is preferably selective dry etching employing an etching gas which is a mixture gas that includes halogen gas, oxygen gas and nitrogen gas, the oxygen gas concentration being 3%.

This is so because the use of such an etching gas makes it possible to easily carry out selective etching by the use of AlGaAs as the etching stopper layer.

In the case that an $In^xGa_{1-x}As$ ($0<x<0.5$) emitter contact layer is provided between the emitter region and the emitter electrode, it is desirable to etch the $In_xGa_{1-x}As$ emitter contact layer with a higher substrate temperature and a greater RF power supplied to the substrate than those of the selective etching conditions employed in the first etching step.

In the case that the $In_xGa_{1-x}As$ emitter contact layer is provided on the emitter region, it is desirable to carry out the selective etching after etching the emitter contact layer separately, because vertical and high-speed etching of the emitter contact layer is difficult under the selective etching conditions employed in the first etching step.

The conditions of etching the $In_xGa_{1-x}As$ emitter contact layer are preferably from 100 to 200° C. for the substrate temperature and 30 W for the RF power supplied to the substrate.

DETAILED DESCRIPTION OF THE PREFERRED EMBODIMENTS

Embodiment 1

Figure 6:
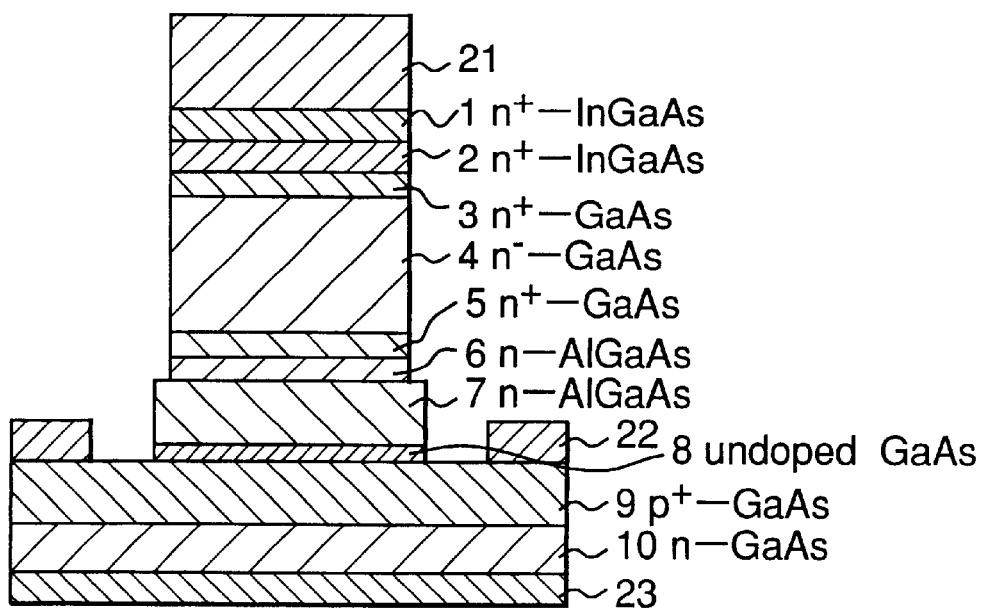
FIG. 6 is a sectional view in the production process of HBT according to the second embodiment of the present invention.
Figure 11:
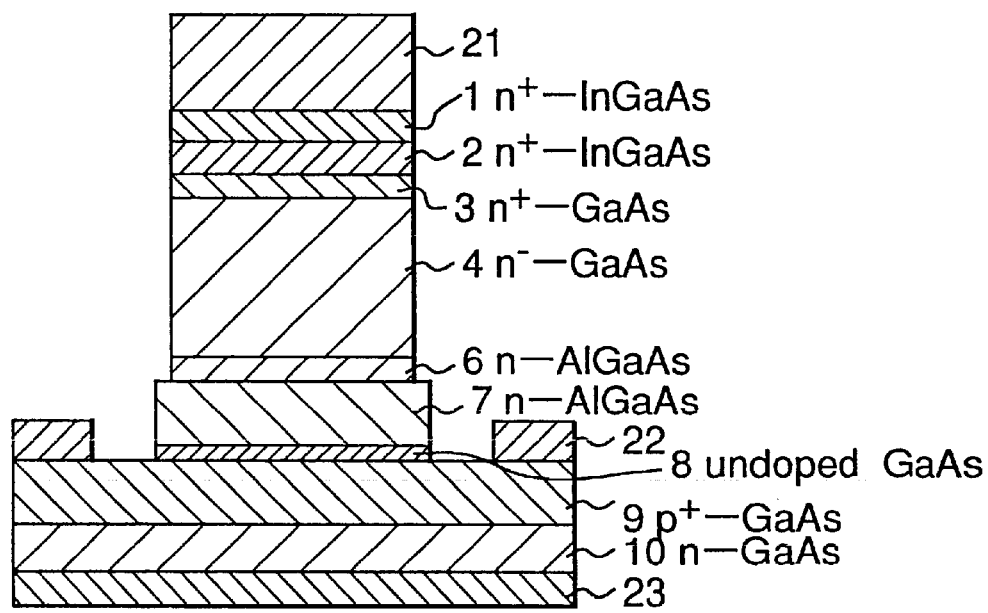
FIG. 11 is a sectional view of an HBT having a conventional configuration.

FIG. 6 shows a crystal structure of the HBT according to the first embodiment of the present invention. In the drawing, the numerals identical with those of FIG. 11 denote identical or corresponding components, while the numeral 5 denotes an $n^+$-GaAs layer and 11 denotes a resist. The crystal structure is a variation of the crystal structure of the conventional HBT shown in FIG. 11 where an $n^+$-GaAs carrier supply layer 5 (carrier concentration: $5 \times 10^{18}$ cm$^{-3}$, film thickness: 3000 Å) is provided between the n-AlGaAs layer 6 and the $n^-$-GaAs ballast resistor layer 4 provided in the emitter layer.

The carrier concentration and film thickness of the $n^+$-GaAs layer 5 are set so that the $n^+$-GaAs layer 5 will not be depleted of the carriers even when the carriers move into the $n^-$-GaAs ballast resistor layer 4, in the case that the $n^+$-GaAs layer 5 is provided between the n-AlGaAs layer 6 and the $n^-$-GaAs ballast resistor layer 4.

In the HBT of the conventional structure shown in table 1, because the $n^-$-GaAs ballast resistor layer 4 is formed on the n-AlGaAs layer 6, carriers move from the n-AlGaAs layer 6 into the n--GaAs ballast resistor layer 4 so that the Fermi levels of both layers are balanced and, as a result, carrier concentration in the n-AlGaAs layer 6 decreases and causes the current amplification factor β to decrease.

In the HBT of this embodiment, the $n^+$-GaAs layer 5 having a high carrier concentration (1.0 to $5.0 \times 10^{18}$ cm$^{-3}$) is provided between the n-AlGaAs layer 6 and the $n^-$-GaAs ballast resistor layer 4, in order to replenish the carriers moving into the $n^-$-GaAs ballast resistor layer 4 by means of the $n^+$-GaAs layer 5 and to prevent the carriers of the n-AlGaAs layer 6 from moving into the $n^-$-GaAs ballast resistor layer 4.

This configuration makes it possible to prevent the carrier concentration in the n-AlGaAs layer 6 from decreasing also in the HBT provided with the $n^-$-GaAs ballast resistor layer 4, and also to stabilize the absolute value of $\phi(\delta V_{BE}/\delta T)$ of HBT, thereby preventing the current amplification factor from decreasing.

Embodiment 2

FIGS. 1 to 6 show the production process of the HBT of the second embodiment of the present invention. In the drawings, the numerals identical with those of FIG. 11 denote identical or corresponding components, while the numeral 5 denotes the $n^+$-GaAs layer and 11 denotes the resist.

Figure 1:
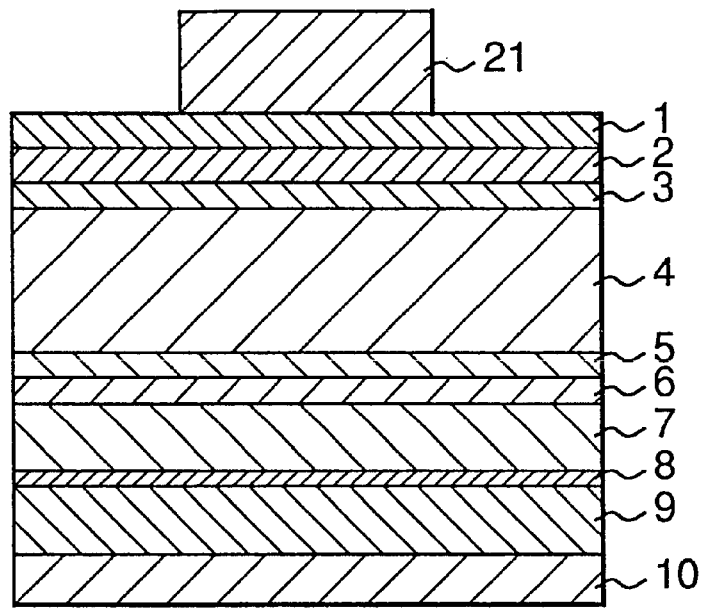
FIG. 1 is a sectional view in the production process of HBT according to the second embodiment of the present invention.

In the production process of the HBT according to this embodiment, first an emitter electrode 21 (made of WSi, film thickness: 4000 Å) which also serves as an etching mask is formed by sputtering or another process on a substrate made by the MBE process or the like, as shown in FIG. 1.

Figure 2:
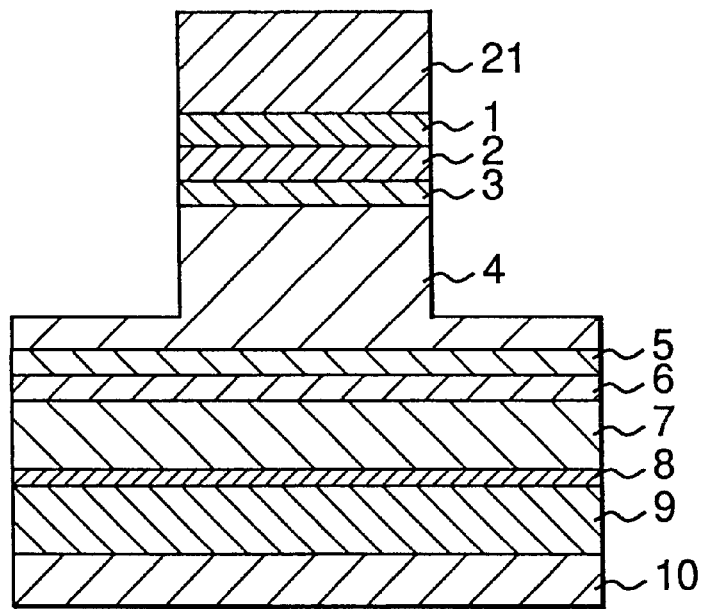
FIG. 2 is a sectional view in the production process of HBT according to the second embodiment of the present invention.

The crystalline substrate is etched down to halfway through the thickness of the n⁻-GaAs ballast resistor layer 4 by using the emitter electrode 21 as the mask, in order to form the emitter mesa through dry etching as shown in FIG. 2.

In such a dry etching process, a miYed gas of $Cl_2$, He, $O_2$ and $N_2$ is preferably used as the etching gas. Also an ECR plasma etching system (FIG. 10) is preferably used because the energy of ions included in the plasma applied to the substrate can be controlled by supplying RF power to the substrate and an exact configuration of the etching mask can be etched out.

The depth of etching was measured by means of a step micrometer (α-STEP) and the etched configuration was observed by SEM observation of the cross section.

Figure 7:
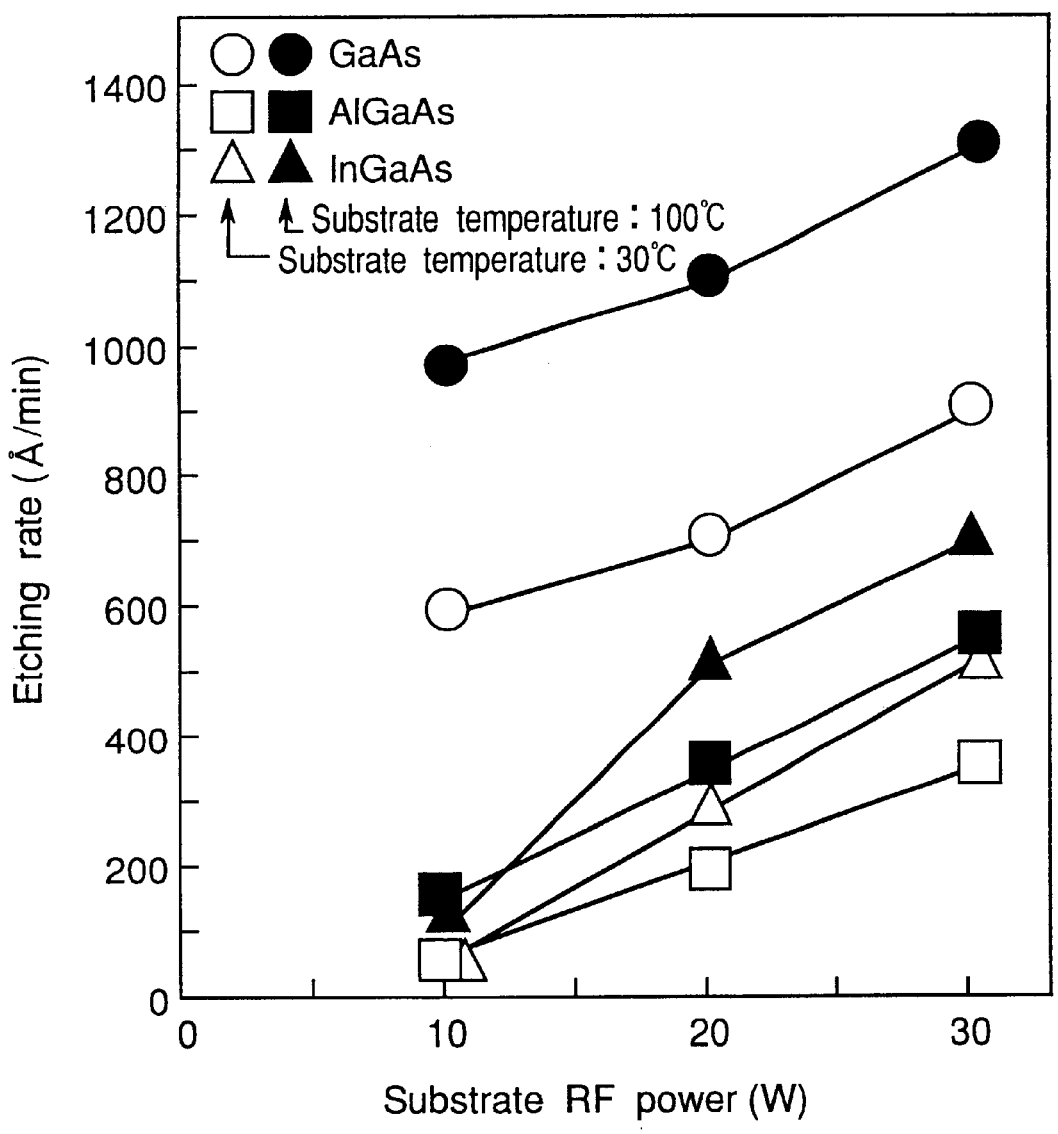
FIG. 7 shows a relation between the RF power supplied to the substrate and the etching speed during the ECR plasma etching using a mixed gas of $Cl_2$, He, $O_2$ and $N_2$.

FIG. 7 shows a relation of RF power supplied to the substrate and the etching rate when $In_{0.50}Ga_{0.50}As$, $Al_{0.26}Ga_{0.74}As$ and GaAs are in the ECR etching system by using the mixed gas of $Cl_2$, He, $O_2$ and $N_2$. Etching was performed by setting the total flow rate of the etching gas to 20 sccm, flow rates of $Cl_2$ and $N_2$ gases both to 2 sccm, $O_2$ concentration to 3%, gas pressure to 0.5 mTorr and microwave power supply constant at 200 W. In FIG. 7, white circles represent the plots for etching with a substrate temperature of 30° C. and black circles represent the plots for etching with a substrate temperature of 100° C.

FIG. 7 shows the dependence of the etching rate of $In_{0.50}Ga_{0.50}As$, $Al_{0.26}Ga_{0.74}As$ and GaAs on the RF power supplied to the substrate.

When the substrate temperature is 30° C. and 10 W of RF power is supplied to the substrate, a selectivity ratio of etching GaAs/AlGaAs as high as 15 (etching rate of AlGaAs is 35 Å/min.) can be obtained, although these conditions do not allow for vertical etching of the InGaAs cross section and a high etching rate.

On the other hand when the substrate temperature is 100° C. and 30 W of RF power is supplied to the substrate, an etching selectivity ratio of GaAs/AlGaAs decreases but vertical etching of $In_{0.50}Ga_{0.50}As$ and a high etching rate (1300 Å/min.) are made possible.

Based on the results of experiments (FIG. 7), etching conditions of HBT are set as follows.

As shown in FIG. 2, the n-InGaAs layers 1 and 2, the n⁺-GaAs layer 3 and a part of the n⁻-GaAs layer 4 are continuously etched in the ECR etching system by using an emitter electrode 21 as a mask and the mixed gas of $Cl_2$, He, $O_2$ and $N_2$.

Etching conditions are set to 30 W for the RF power supplied to the substrate and 100° C. for the substrate temperature, because these conditions lower the etching selectivity ratio of GaAs/AlGaAs but make vertical etching of InGaAs layers 1 and 2 which are emitter contact layers and high etching rate possible, based on the results shown in FIG. 7.

Figure 3:
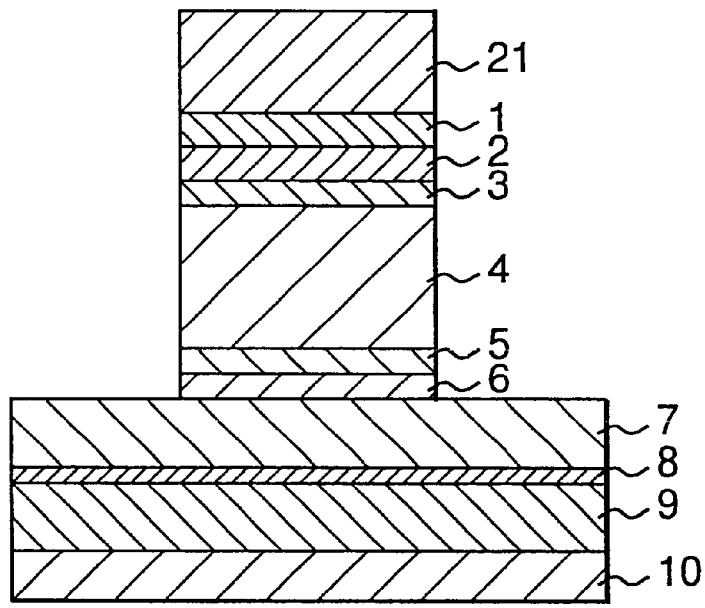
FIG. 3 is a sectional view in the production process of HBT according to the second embodiment of the present invention.
Figure 4:
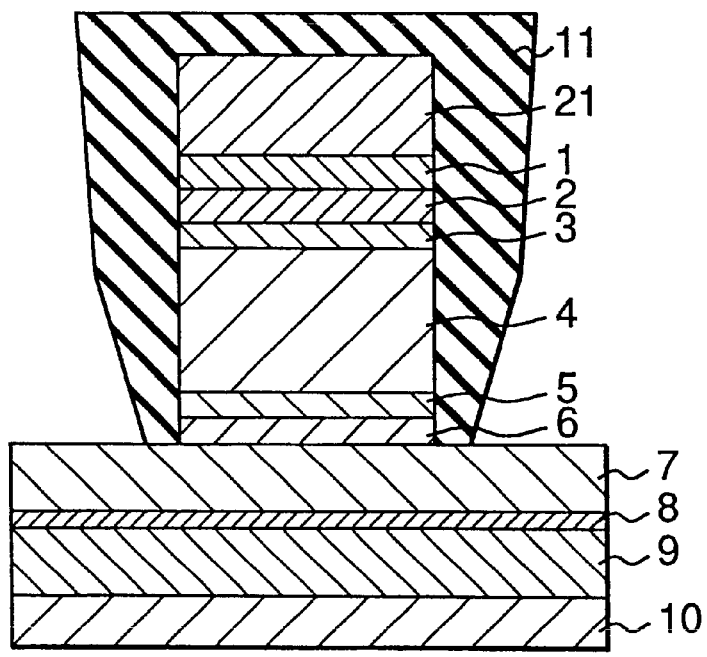
FIG. 4 is a sectional view in the production process of HBT according to the second embodiment of the present invention.

After the etching of FIG. 2, the remainder of the n⁻GaAs ballast resistor layer 4, the n⁺-GaAs layer 5 and the n-AlGaAs layer 6 are etched (second run of etching) by using the same etching gas in the ECR plasma etching system, under the conditions which give a high selectivity ratio of GaAs/AlGaAs, namely RF power of 10 W is supplied to the substrate and a substrate temperature of 30° C., as shown in FIG. 3.

Because the proportion of Al in the n-AlGaAs layer 6 increases from 0 to 0.26 through the thickness of the AlGaAs layer toward the bottom, AlGaAs is etched out at the same etching rate as that for GaAs in a region where the proportion of Al is 0.20 or lower, although the etching process becomes markedly selective as etching proceeds and the proportion of Al exceeds 0.20, such a stage is reached as etching of the GaAs layer proceeds but the AlGaAs layer is hardly etched further.

Consequently, an AlGaAs layer having the proportion of Al higher than 0.20 can be used as an etching stopper layer.

As a result, the etching process is almost stopped near the interface of the n-AlGaAs layers 6 and 7 of the emitter region, as shown in FIG. 3.

Figure 8:
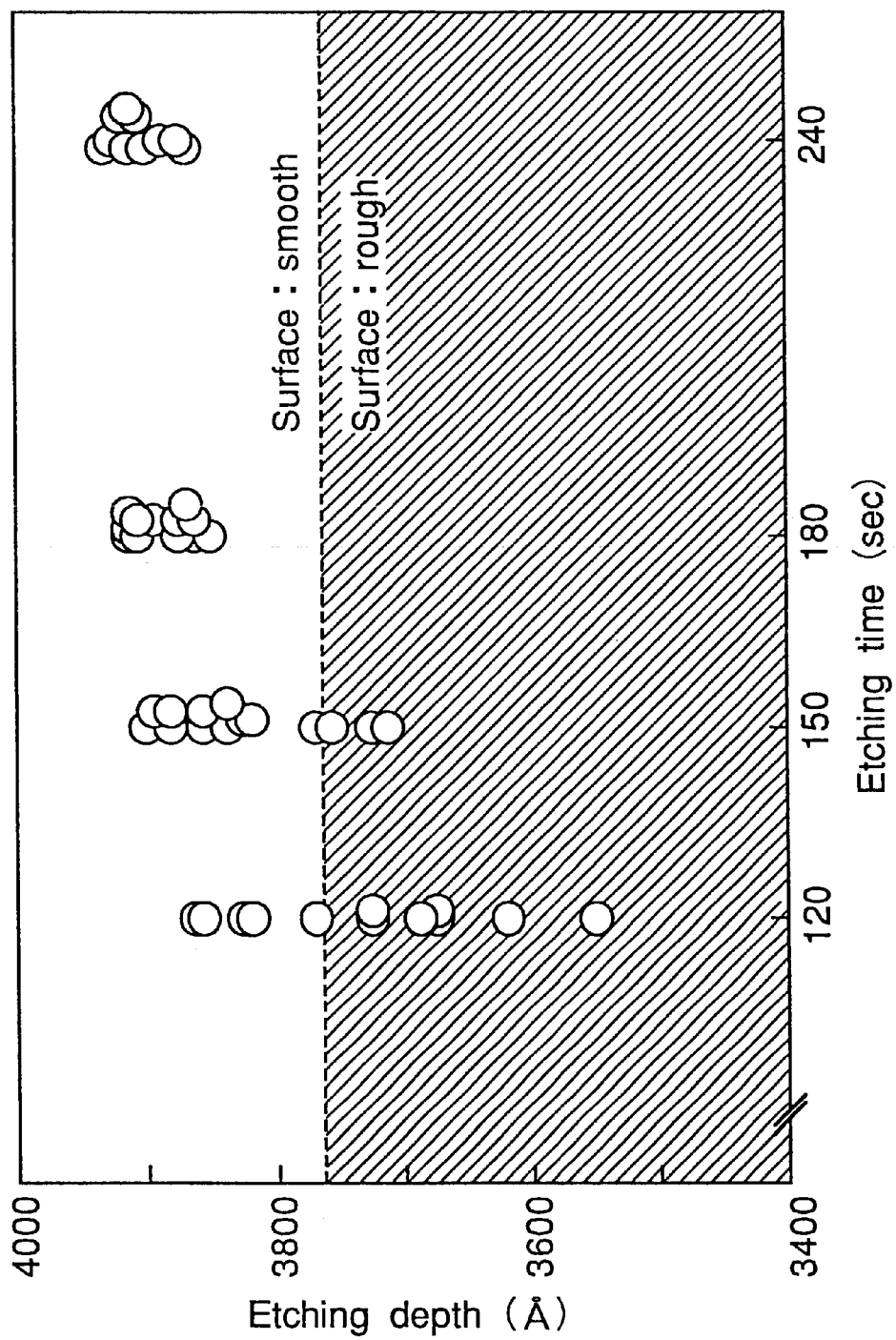
FIG. 8 shows a relation between the etching time and the depth of etching in the selective etching.

FIG. 8 shows the change in the depth of etching with the duration of etching (second run of etching) carried out under such conditions that give a high selectivity ratio of GaAs/AlGaAs. It can be seen from FIG. 8 that, although there are variations in the depth of etching in the early stage of etching, the variations decrease as the etching proceeds to a depth of about 3900 521 and etching hardly proceeds further. This is so because when etching reaches the AlGaAs layer having the proportion of Al higher than 0.20, the AlGaAs layer is hardly etched but etching in other regions where the progress of etching, has been slow continues until the AlGaAs layer having the proportion of Al higher than 0.20 is reached. Observation of the etching depth shown in FIG. 8 also indicates that the etching process stops near the interface of the n-AlGaAs layers 6 and 7. Variation in etching also reduces as the etching proceeds, and the depth of etching after 180 seconds of the etching process is within a range of 3900±35 Å (measured at 16 points on the wafer surface).

Figure 9A:
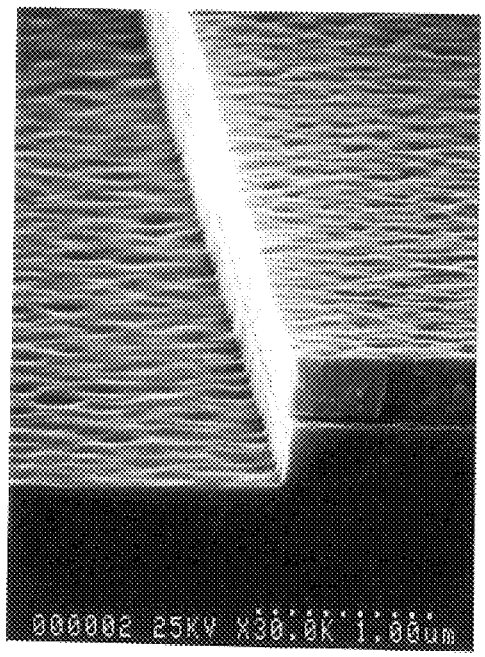
FIG. 9A shows a surface SEM photograph of the AlGaAs layer after the selective dry etching.
Figure 9B:
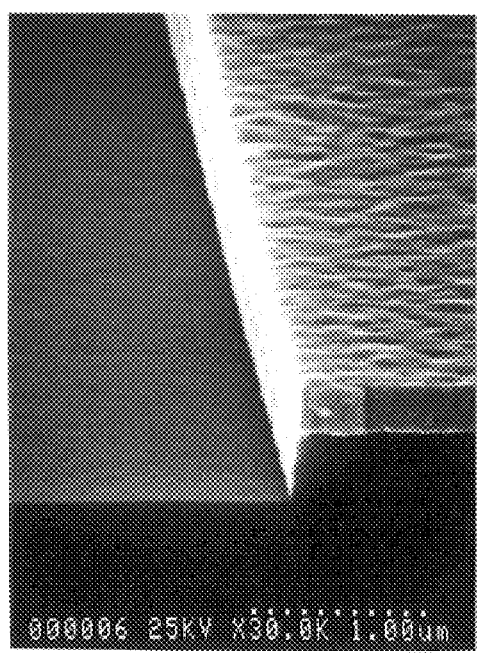
FIG. 9B shows a surface SEM photograph of the AlGaAs layer after the conventional dry etching.

FIG. 9A shows a SEM photograph of an etched-out configuration obtained through the selective etching after 180 seconds of the etching process according to this embodiment and FIG. 9B shows a SEM photograph of the etched-out configuration obtained without selective etching after 180 seconds of the etching process.

FIG. 9A shows that etching has been done at right angles to the WSi mask and good morphology of the etched surface (AlGaAs) is obtained, while FIG. 9B shows that the cross section is not at right angles to the surface and that the morphology of the etched surface is poorer.

The emitter layer (n-AlGaAs layer 7, non-doped GaAs layer 8) is etched and the regions above the n-AlGaAs layer 7 are covered with the resist 11, in order to form emitter guard ring layers 17, 18.

The resist 11 is formed by coating the entire surface with the resist and then removing the resist from the unnecessary portion in photolithography process.

Figure 5:
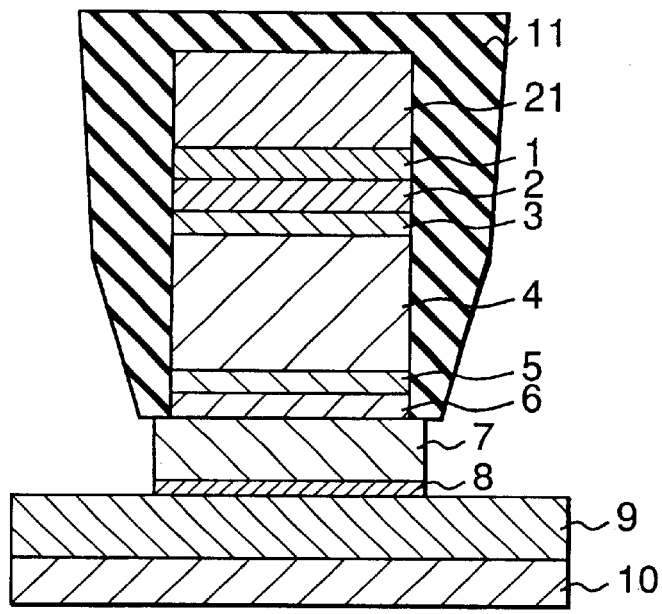
FIG. 5 is a sectional view in the production process of HBT according to the second embodiment of the present invention.

Wat etching by means of tartaric acid is applied to the n-AlGaAs layer 7 and the non-doped GaAs layer 8 by using the resist 11 as a mask, thereby exposing the p-GaAs base surface 9 as shown in FIG. 5.

Measurements taken of the of etching depth at 16 points on the wafer surface showed that the depth of etching was in a range of 4830±40 Å and a highly uniform etched surface with surface variation within ±1% could be obtained.

In the last stage, a base electrode 22 and a collector electrode 23 are formed by vapor deposition or another process thereby to complete the HBT, as shown in FIG. 6.

With the method of producing the HBT according to this embodiment, as described above, the etching step for exposing the p-GaAs base surface 9 is divided into the first dry etching and the second dry etching.

As a result, the InGaAs emitter contact layer can be etched vertically in the first dry etching, making it possible to obtain an etched configuration close to that of the etching mask (WSi).

In the second dry etching, since etching is carried out by using the AlGaAs layer of the emitter layer as the etching stopper layer, variations in the final etching depth can be reduced and a flat etched surface can be obtained.

Figure 10:
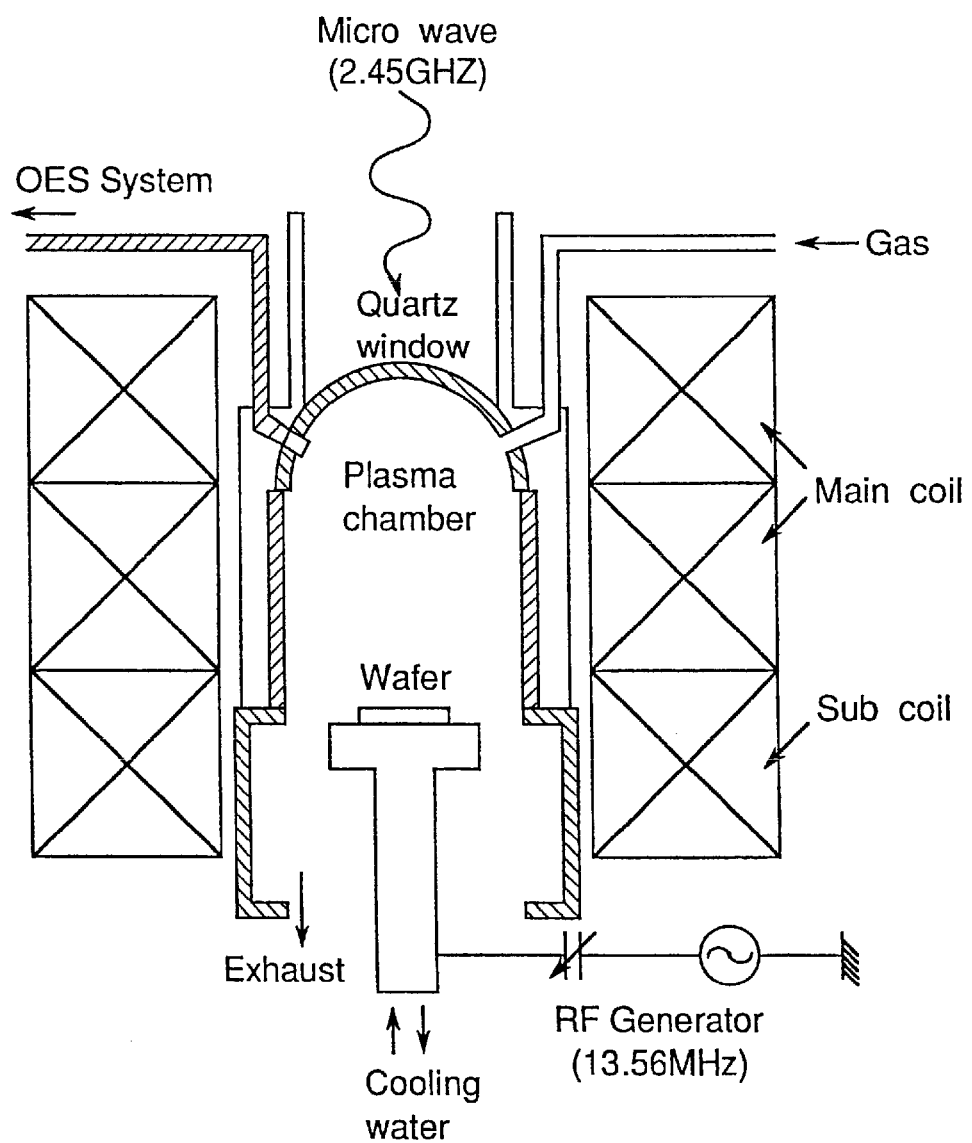
FIG. 10 shows an ECR plasma etching system used for carrying out the present invention.

Although etching of the crystal structure (FIG. 6) having $n^+$-GaAs of the first embodiment of the present invention has been described in this embodiment, the method of this embodiment can be applied also to the conventional crystal structure (FIG. 10).

What is claimed is:

1. A method for producing a heterojunction bipolar transistor which comprises steps of:

forming a first conductivity type GaAs collector substrate;

laminating a second conductivity type GaAs base region, and an emitter region which includes at least a first conductivity type AlGaAs layer, a first conductivity type GaAs carrier supply layer formed on the first conductivity type AlGaAs layer, and a first conductivity type GaAs ballast resistor layer formed on the first conductivity type GaAs carrier supply layer, on the first conductivity type GaAs collector substrate;

forming a emitter electrode on the emitter region;

etching the emitter region until the base region is exposed by using the emitter electrode as a mask, thereby forming emitter mesa portions; and providing a base electrode on the base region and a collector electrode on the collector region, respectively.

2. A method for producing a heterojunction bipolar transistor according to claim 1, wherein the step of forming the emitter mesa portions includes a first step of etching the emitter region down to the first conductivity type AlGaAs layer through selective etching by using the first conductivity type AlGaAs layer as etching stopper layer, and a second etching step of etching the remaining emitter region until the base region is exposed.

3. A method for producing a heterojunction bipolar transistor according to claim 2, wherein the first etching step is selective dry etching employing an etching gas which is a mixture gas including halogen gas, oxygen gas and nitrogen gas, the oxygen gas concentration being 3%.

4. A method for producing a heterojunction bipolar transistor according to claim 2, further comprising:

providing an $In_xGa_{1-x}As$ (0<x<0.5) emitter contact layer on the emitter region; and etching the $In_xGa_{1-x}As$ emitter contact layer with higher substrate temperature and greater RF power supplied to the substrate than those of the selective etching conditions employed in the first etching step.

* * * * *